(12) United States Patent
Slater et al.

(10) Patent No.: US 6,275,168 B1
(45) Date of Patent: *Aug. 14, 2001

(54) EXPANSION MODULE FOR MODULAR METER

(75) Inventors: Byron J. Slater; John T. Voisine, both of Lafayette, IN (US)

(73) Assignee: Siemens Power Transmission and Distribution, LLC, Wendell, NC (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/227,433

(22) Filed: Jan. 8, 1999

Related U.S. Application Data

(63) Continuation-in-part of application No. 08/862,844, filed on May 23, 1997, now Pat. No. 5,933,004.
(60) Provisional application No. 60/070,946, filed on Jan. 9, 1998.

(51) Int. Cl.[7] ................................................ G01R 11/32
(52) U.S. Cl. .................... 340/870.02; 324/142; 324/110; 324/156
(58) Field of Search ....................... 340/870.02; 324/142, 324/110, 157, 364, 107, 156; 336/92

(56) References Cited

U.S. PATENT DOCUMENTS

| | | | |
|---|---|---|---|
| 2,047,384 | 7/1936 | Richterkessing | 439/682 |
| 3,355,630 | 11/1967 | Orr | 361/669 |
| 4,175,813 | 11/1979 | Mentesana | 439/135 |
| 4,258,968 | 3/1981 | Holt | 439/108 |
| 4,791,362 | * 12/1988 | Philpot | 324/142 |
| 5,039,936 | 8/1991 | Gonzales | 324/108 |
| 5,041,001 | 8/1991 | Giles | 439/189 |
| 5,097,383 | 3/1992 | Heard et al. | 361/662 |
| 5,196,783 | 3/1993 | Howell | 324/110 |
| 5,315,236 | 5/1994 | Lee | 324/157 |
| 5,933,004 | * 8/1999 | Jackson | 324/142 |
| 6,008,711 | * 12/1999 | Bolam | 336/92 |

\* cited by examiner

*Primary Examiner*—Michael Horabik
*Assistant Examiner*—Albert K. Wong

(57) ABSTRACT

An electronic utility meter includes a sensor module, a measurement module, and a removable expansion module. The sensor module connects to the electrical system of a facility, and includes voltage and current sensors. The voltage and current sensors are operable to receive voltage and current signals from the electrical system and generate measurement signals therefrom. The measurement module includes a measurement circuit operable to receive measurement signals and generate energy consumption data therefrom. The measurement module further includes a device for communicating information relating to the energy consumption data. The measurement module is configured to couple to the sensor module to connect the measurement circuit to the voltage and current sensors. The removable module is interposed between the sensor module and the measurement module. The removable module operably couples the measurement circuit to the voltage and current sensors.

21 Claims, 10 Drawing Sheets

EXPANSION MODULE FOR MODULAR METER

CROSS REFERENCE TO RELATED APPLICATION

This is a continuation-in-part of U.S. patent application Ser. No. 08/862,844, filed May 23, 1997 now U.S. Pat. No. 5,933,004. This application claims the benefit of A U.S. Provisional Patent Application Ser. No. 60/070,946 filed Jan. 9, 1998.

FIELD OF THE INVENTION

The present invention relates generally to the field of metering devices, and in particular, to electrical utility revenue meters.

BACKGROUND OF THE INVENTION

Electrical utility revenue meters, or simply revenue meters, are devices that, among other things, measure electrical energy consumed by a residence, factory, commercial establishment or other such facility. Electrical utilities rely on revenue meters for many purposes, including billing customers and tracking demand for electrical power. A common form of revenue meter comprises an inductive drive that rotates a spinning disk at an angular velocity proportional to the amount of power being consumed. The spinning disk drives mechanical counters that provided an indication of power consumed over time.

Over recent years, electronic meters have been developed that are replacing the spinning disk meter design in several applications. Electronic meters use electronic circuits to measure, quantify and display energy consumption information. In general, electronic meters may be divided into two portions, a sensor portion and a measurement portion. The sensor portion includes sensor devices that are connected to the electrical system of a facility, and more particularly, to the power lines. The sensor devices generate signals that are indicative of the voltage and current in the power lines. In general, the sensor portion of a revenue meter operates with the high voltages and currents that are present on the power lines.

The measurement portion of an electronic meter uses the signals generated by the sensor portion to determine watt-hours, VA, VAR and other information that quantifies the power consumed by the facility. The measurement portion typically also includes a display for displaying the power consumption information. In contrast to the sensor portion, the measurement circuit works with reduced or attenuated voltage and current signals that are compatible with electronic devices, and in particular, digital electronic devices.

Occasionally, revenue meters can malfunction or suffer damage through external forces and require repair or replacement. Repair or replacement of many commonly-used revenue meters presently require an interruption in the electrical power to the facility being metered. In general, power service interruptions are extremely undesirable from the electrical utilities' perspective because they reduce customer satisfaction. Accordingly, there exists a need for a revenue meter that may be repaired or replaced without interrupting power service to the facility being metered.

Another problem that has arisen due to the advent of electronic meters pertains to service upgrades. In general, electronic meters offer a wide variety of features that are facilitated by digital electronics. These features may include power demand monitoring, communications, and power line and meter diagnostics. Because these features are facilitated by the digital circuitry in the measurement portion of the meter, the services or functions available in an electronic-type revenue meter may be altered by replacing digital circuit components in the measurement portion of the meter.

For example, consider a utility that installs several electronic meters without power demand monitoring because it is deemed unnecessary at the time of installation. A year later that utility may determine that it would be desirable to have the power demand monitoring capability in those meter installations. The installed electronic meters may, in theory, be upgraded to provide that capability typically by replacing portions of the electronic portion. The sensor portion components would not need to be replaced.

As a practical matter, however, it is often more convenient to replace the entire meter rather than the individual digital circuit components. Accordingly, enhancement of the capabilities of the metering often requires replacement of the entire meter. Replacement of the entire meter, however, undesirably creates waste by forcing the replacement of relatively costly, and perfectly operable, sensor components.

A meter introduced by Asea Boveri & Brown ("ABB") addresses this concern by providing a modular meter that includes a sensor portion and a removable measurement portion. The measurement portion may be removed from the sensor module and replaced with another measurement portion having enhanced functionality. The ABB meter, however, has significant drawbacks. For example, the measurement portion of the ABB meter can not be replaced while the sensor portion is connected to an electrical system of a facility because removal of the measurement portion would expose extremely dangerous voltages and currents to a human operator or technician. Thus, although the modular design allows for upgrades, the power to the facility must nevertheless be interrupted to perform such upgrades for safety purposes.

A further problem with the ABB meter arises from its bulkiness. The sensor portion of the ABB meter is enclosed in housing and the measurement portion is enclosed in another housing. Both housings include large areas of unused space that increase the bulkiness of the meter. The bulkiness undesirably increases costs in shipping and storing of the meters both as assembled or in their modular components.

There exists a need, therefore, for a modular meter having modular components that may be removed or replaced without interruption to the electrical power service to the facility to which the meter is connected. There is also a need for a revenue meter having reduced bulkiness. There is a still further need for a modular meter that can be readily upgraded with custom circuit enhancements.

SUMMARY OF THE INVENTION

The present invention overcomes the above stated needs, as well as others, by providing a modular safety meter comprising a sensor module, a measurement module, and a removable expansion module. The sensor module and measurement module may be combined to form an electronic utility meter having at least basic metering functions. To provide additional functionality to the meter, the removable expansion module may be combined with sensor module and measurement module. The basic modular construction allows for less expensive replacement of the measurement components because the entire meter need not be replaced. The use of removable expansion modules further provides the ability to easily upgrade the modular meter. Use of one or more modular expansion modules allows end users to custom-configure their meter to suit their own needs. The modular structure facilitates straightforward and intuitive meter upgrade procedures, especially in meters that are already in use.

An exemplary embodiment of the present invention is an electronic utility meter comprising a sensor module, a measurement module, and a removable expansion module. The sensor module connects to the electrical system of a facility, and includes voltage and current sensors. The voltage and current sensors are operable to receive voltage and current signals from the electrical system and generate measurement signals therefrom. The measurement module includes a measurement circuit operable to receive measurement signals and generate energy consumption data therefrom. The measurement module further includes a device for communicating information relating to the energy consumption data. The measurement module is configured to couple to the sensor module to connect the measurement circuit to the voltage and current sensors. The removable module is interposed between the sensor module and the measurement module. The removable module operably couples the measurement circuit to the voltage and current sensors.

Optionally, the removable module may include an enhancement circuit that enhances the operation of the electronic revenue meter. For example, the enhancement circuit may include a communication circuit, a load profile circuit, a power quality circuit and/or other circuits. In addition, the sensor module optionally includes an electrically safe interface that inhibits human contact with hazardous voltages present in the voltage and current sensors when the measurement module and expansion module are removed from the sensor module. With such an electrically safe interface, the meter may readily be upgraded in the field without removing power from the facility to which it is connected.

The above discussed features and advantages, as well as others, may readily be ascertained by those of ordinary skill in the art by reference to the following detailed description and accompanying drawings.

DETAILED DESCRIPTION

Figure 1:
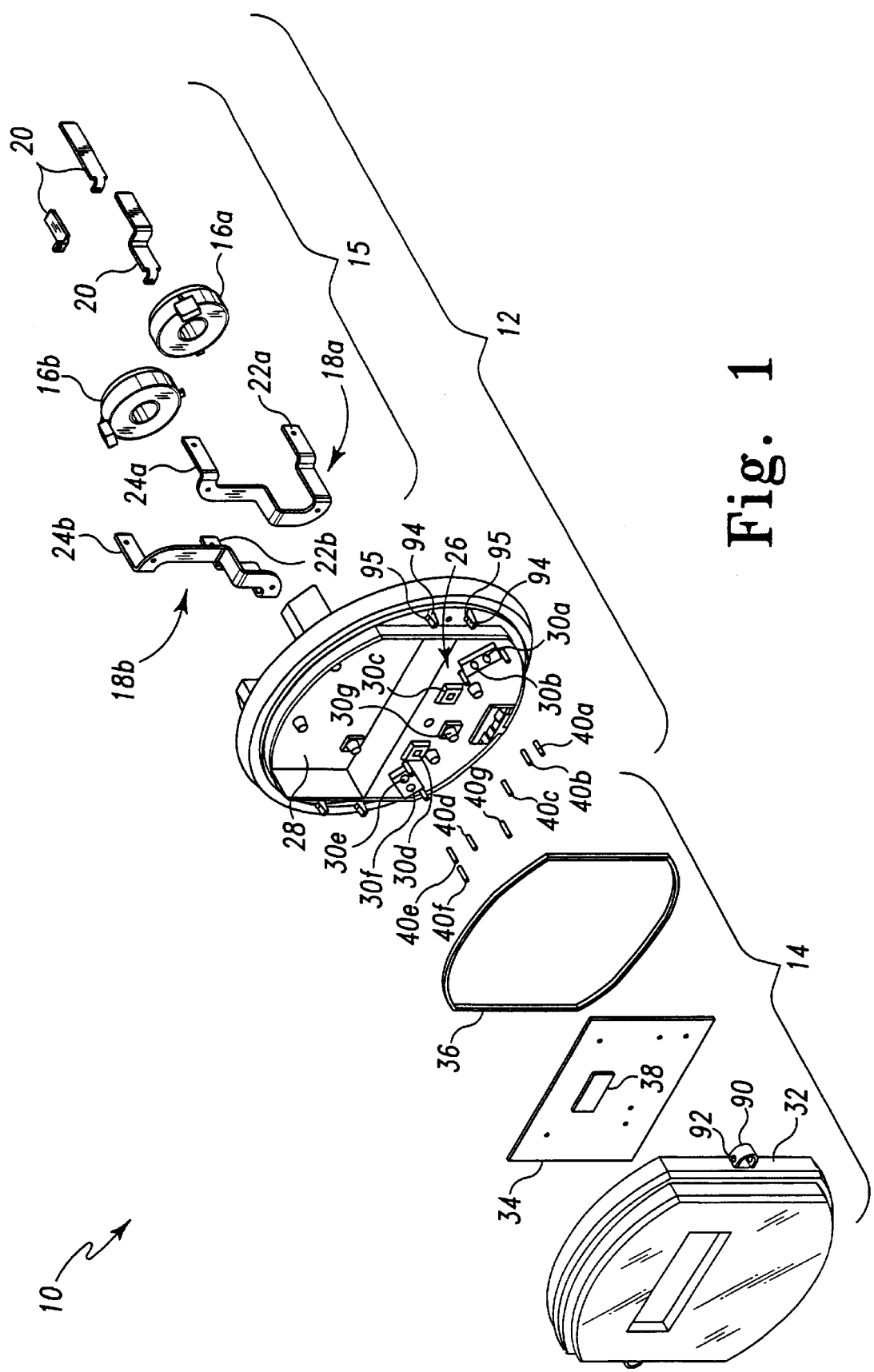
FIG. 1 shows an exploded view of an exemplary embodiment of a revenue meter according to the present invention without an expansion module.

FIG. 1 shows an exploded view of an exemplary revenue meter 10 according to the present invention. Note, however, that the revenue meter 10 is shown without a removable expansion module. The revenue meter 10 preferably performs at least the basic revenue metering functions without an expansion module. As will be discussed below, one or more expansion modules may be added to the revenue meter 10 to provide enhanced metering and non-metering functionality.

Referring to FIG. 1, the revenue meter 10 includes a sensor module 12 and a measurement module 14. The revenue meter 10 is constructed as described below such that the measurement module 14 is removable from the sensor module 12. The exemplary revenue meter 10 is a type of meter known in the revenue metering industry as a 12S meter form. The meter form relates to the meter installation, for example, whether it is single phase or polyphase. In any event, it will be noted that the present invention is not limited to applications involving 12S meter forms, but may readily be incorporated into 2S, 3S, 4S, 8S/9S and other well known meter forms by those of ordinary skill in the art.

The sensor module 12 includes voltage and current sensors, which according to the exemplary embodiment described herein, include first and second current transformers 16a and 16b, respectively, first and second current coils 18a and 18b, respectively, and one or more neutral blades 20. The first current coil 18a includes first and second ends defining first and second current blades 22a and 24a, respectively, to be received by the jaws of a compatible meter socket. (See FIG. 2) The second current coil 18b likewise includes first and second ends defining first and second current blades 22b and 24b, respectively, to be received by the jaws of the compatible meter socket. (See FIG. 2)

The first and second current transformers 16a and 16b, respectively, are preferably toroidal transformers having a substantially circular shape defined by a circular core. In the present embodiment, the first current transformer 16a has a turns ratio of N1 and the second current transformer has a turns ratio of N2. Using such toroidal current transformers, the first current coil 18a, when assembled, passes through the interior of the toroid of the first current transformer 16a. Preferably, the current transformer 16a is arranged such that the axial dimension of the current transformer 16a is substantially parallel to the axial dimension of the sensor module 12. In other words, the current transformer 16a is horizontally-disposed within the sensor module 12. The second current transformer 16b and the second current coil 18b are preferably arranged in a similar manner within the sensor module 12. Accordingly, the second current transformer 16b is also horizontally disposed within the sensor module 12. The use of horizontally disposed toroidal current transformers reduces the thickness and thus reduces the overall bulk of the meter 10.

The sensor module 12 further includes an electrically safe interface 26. The electrically safe interface 26 comprises a first interconnecting means for connecting to the measurement module 14. The electrically safe interface 26 also includes means for preventing physical contact of a human operator with potentially hazardous electrical signals present on at least a portion of the voltage and current sensors 15. Signal levels which are considered potentially hazardous are well-known. Different levels of potential hazard also exist. For example, signals capable of generating shock currents exceeding 70 milliamperes are possible burn hazards, while signals generating shock currents on the order of 300 milliamperes may constitute life threatening hazards. Furthermore, signals generating shock currents as low as 0.5 to 5 milliamperes are known to cause an involuntary startle reaction.

In revenue meters, including the meter 10 of the present invention, at least some of the sensor devices carry such potentially hazardous electrical signals. Specifically, any portion of the sensor module 12 that is electrically connected to the voltage and current signals from the power line constitutes a life threatening hazard and must be isolated from human contact by the electrically safe interface 26. In the present embodiment, the current coils 18a and 18b are directly connected to the facility power line and therefore must be isolated. By contrast, the current transformers 16a and 16b, do not necessarily carry life threatening currents because, as discussed later, the current transformers 16a and 16b are not directly coupled to the facility power lines. Accordingly, depending on the highest level of expected current flowing through the current transformers 16a and 16b, the current transformers 16a and 16b may or may not carry potentially hazardous electrical signals. In any event, however, the electrically safe interface 26 preferably prevents human contact with all of the voltage and current sensors 15 as a safety measure.

In the present embodiment, the means for preventing physical contact includes a top plate 28, and a plurality of sockets 30a, 30b, 30c, 30d, 30e, 30f and 30g. Each of the sockets 30a through 30g defines an opening in the top plate 28. Other than the openings defined by the sockets 30a through 30g, the top plate 28 preferably forms a complete barrier or wall from the measurement module 14 to the voltage and current sensors 15.

Alternatively, at a minimum, the top plate 28 operates to prevent human contact with the portions of the voltage and current sensors 15 that directly contact the power lines of the facility, and in particular, the current coils 18a and 18b.

Figure 1A:
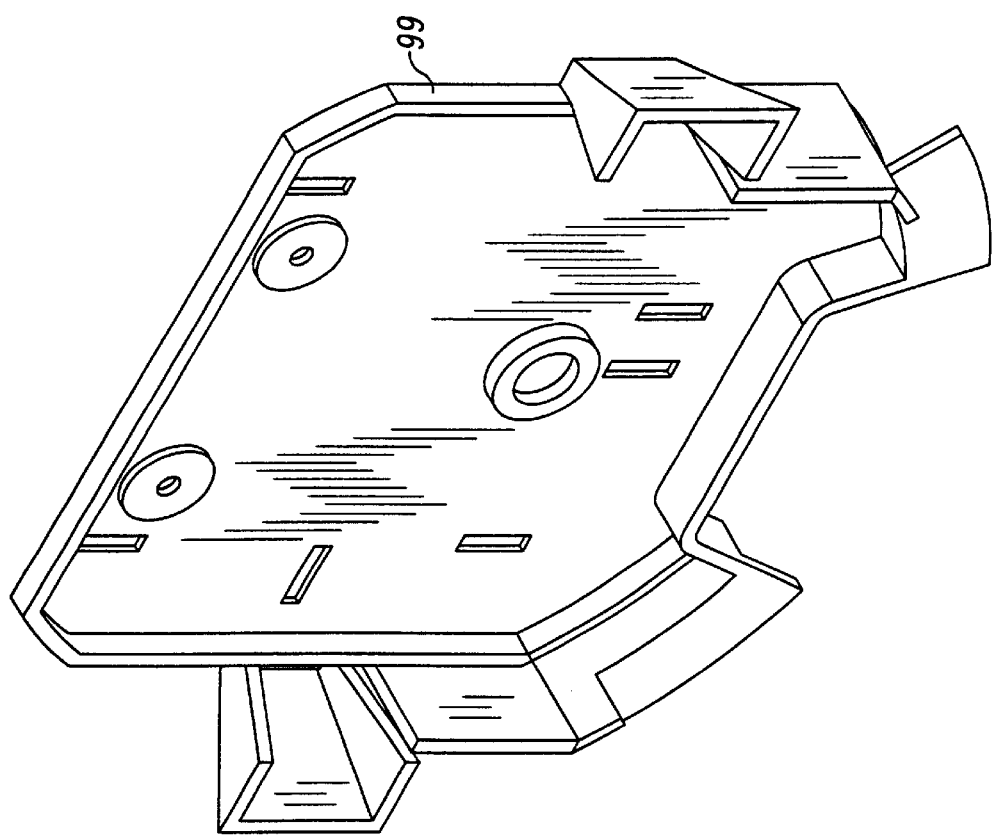
FIG. 1A shows an optional bottom structure for the meter of FIG. 1.
Figure 2:
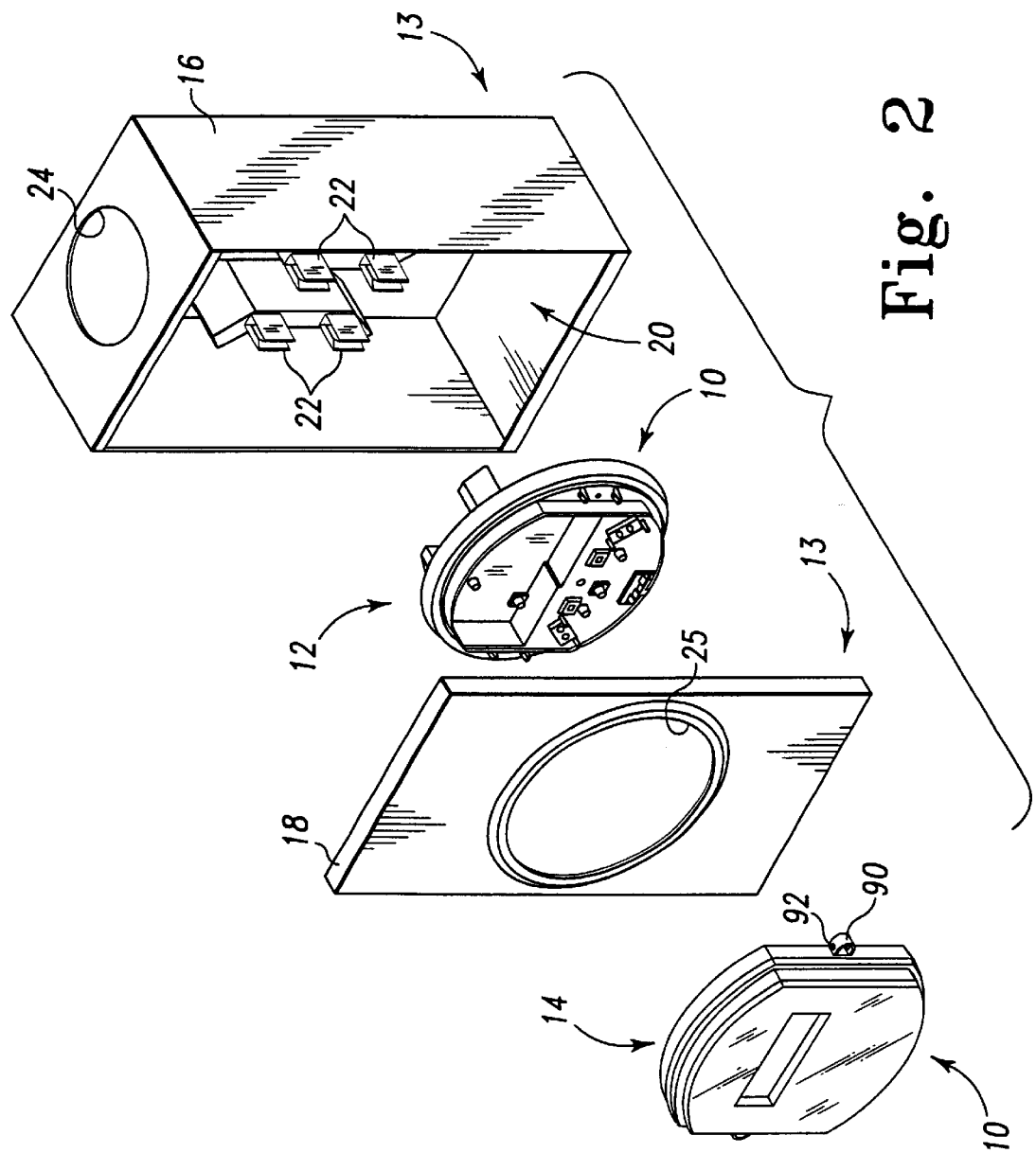
FIG. 2 shows an exemplary installation configuration that includes the meter from FIG. 1, and a meter box comprising a housing and a cover.

In order to provide a complete barrier, the top plate 28 cooperates with the meter mounting device or an alternative bottom structure that encloses the voltage and current sensors 15 from the side and bottom. FIG. 1A shows an exemplary bottom structure 99 that may be used to cooperate with the top plate 28 of FIG. 1 to enclose the voltage and current sensors 15. FIG. 2, discussed below describes an exemplary meter mounting device that may be used to cooperate with the top plate 28 to enclose the voltage and current sensors 15.

In yet another alternative embodiment, the top plate 28 may be integral with a side structure or side and bottom structure that completely encases the voltage and current sensors 15.

Referring again to FIG. 1, the sockets 30a through 30g and their corresponding openings are preferably configured to prevent a human operator from physically contacting the electrically conductive portions of the socket. In particular, the openings defined by the sockets 30a through 30g have sufficiently diminutive proportions to prevent contact of a standard test finger with the electrically conductive portions of the sockets 30a through 30g. A standard test finger is a mechanical device used in the electrical industry to determine whether an electrical connection socket is safe from accidental contact by a human finger. One standard test finger is described in Underwriter's Laboratory, Inc., *Standard For Safety of Information Technology Equipment Including Electrical Equipment Business* UL-1950 (Feb. 26, 1993).

In the present embodiment, the openings defined by the sockets 30a through 30g preferably have a first dimension, for example, the length, and a second dimension, for example, the width, wherein the first dimension has at least the same size as the second dimension, and the second dimension is less than ⅛ inch, thereby preventing substantial access of a human operator through the openings.

Figure 9:
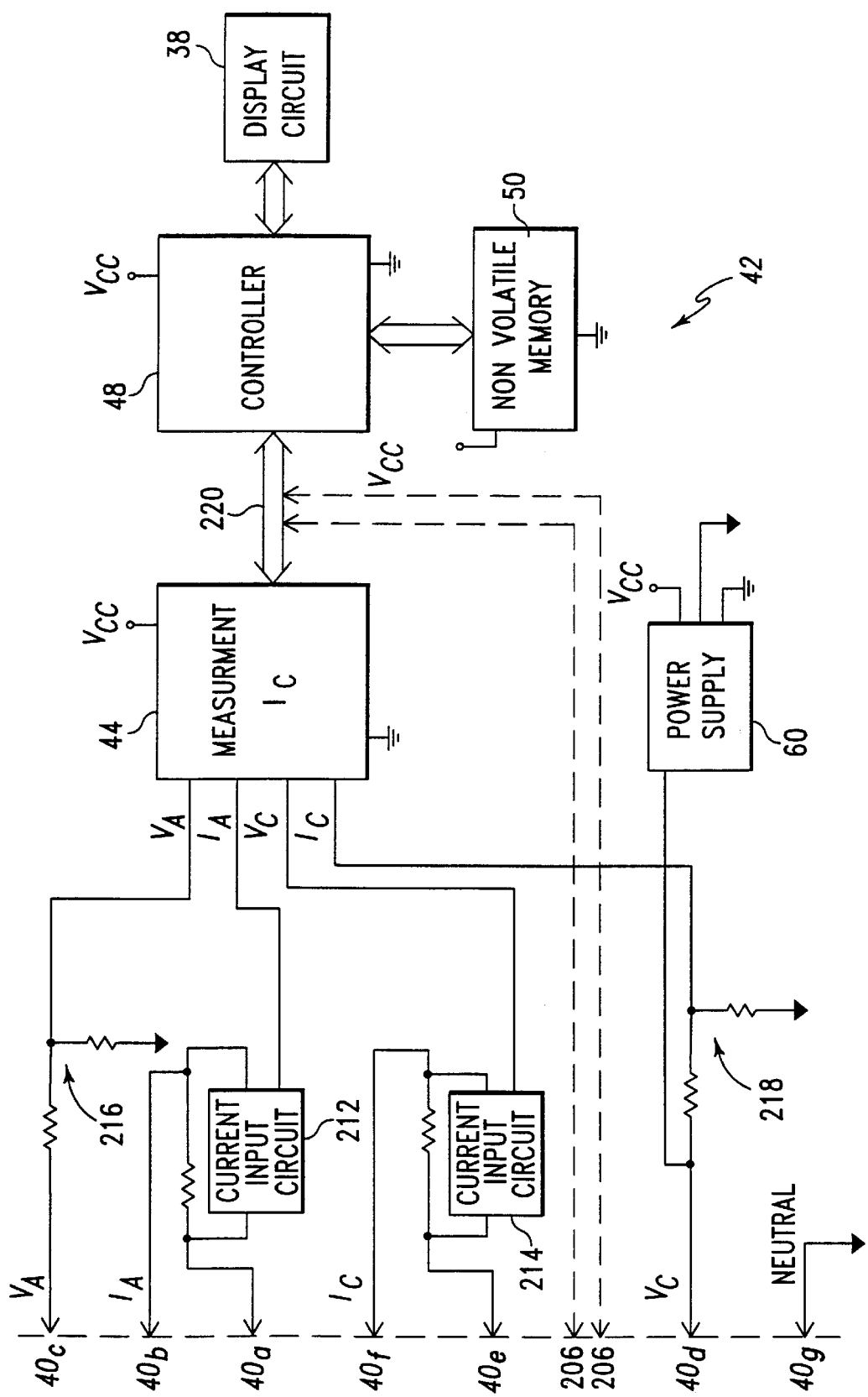
FIG. 9 shows an exemplary measurement circuit and associated display for use on the printed circuit board in the measurement module of revenue meter of FIGS. 1 and 4.

The measurement module 14 comprises a face cover 32, a printed circuit board 34, and a gasket 36. The printed circuit board 34 includes a display 38, and a measurement circuit. FIG. 9, discussed further below, shows a circuit block diagram of a measurement circuit 42 that may readily be used as the measurement circuit on the printed circuit board 34 of FIG. 1. The measurement circuit is operable to receive measurement signals and generate energy consumption data therefrom. The measurement circuit is operably connected to provide the energy consumption data to the display 38.

The measurement module 14 further includes second interconnecting means operable to cooperate with first interconnecting means (on the sensor module 12) to connect the measurement circuit of the printed circuit board 34 to the voltage and current sensors 15. For example, in the present embodiment, the measurement module 14 includes a plurality of plugs 40a through 40g that are received by the corresponding plurality of sockets 30a through 30g. The plurality of plugs 40a through 40g, when assembled, are electrically connected to the measurement circuit and physically connected to the printed circuit board 34.

FIG. 2 shows an installation configuration that includes the meter 10 and a meter box 13 comprising a housing 16 and a cover 18. The housing 16 is box-like in structure having an opening for receiving the cover 18 and a cabling opening 24 for receiving the power lines of the electrical system being metered, not shown. It will be appreciated that the housing 16 need not be box-like in structure, and that any other suitable shape may be used, as long as there is an opening for receiving a cooperating meter box cover and a cabling opening. The housing 16 further includes an interior 20. Within the interior 20 are located a plurality of jaws 22 constructed of electrically conductive material. When installed into a facility, the plurality of jaws 22 are electrically connected to the power lines of the electrical system of the facility.

The plurality of jaws 22 receive and provide electrical connection to the current coil blades 22a, 24a, 22b and 24b (see FIG. 1) as well as the neutral blade or blades 20. The relationship of the jaws and the blades 22a, 24a, 22b, and 24b also define the alignment of the sensor module 12 within the housing 16. Once the blades 22a, 24a, 22b, and 24b (see FIG. 1) are engaged with the plurality of jaws 22 (FIG. 2), the sensor module 12 is installed within the interior 20 of the housing 16. The cover 18 is then installed onto the housing 16. The cover 18 includes a meter opening 25 having a perimeter defined by the perimeter of the sensor module 12. Preferably, the perimeter of the meter opening 25 has substantially the same shape and is slightly smaller than the perimeter of the sensor module 12 such that the sensor module 12 cannot be removed when the cover 18 is engaged with the housing 16.

Once the cover 18 is installed, the measurement module 14 in the present embodiment is placed in engagement with the sensor module 12 through the meter opening 25 of the meter box cover 18. When in engagement, the plugs 40a through 40g of the measurement module 14 are electrically connected to the sockets 30a through 30g, respectively, of the sensor module 12. Once the measurement module 14, the cover 18, the sensor module 12, and the housing 16 are all assembled as described above, the meter 10 (i.e., the sensor module 12 and the measurement module 14) performs energy consumption measurements on the electrical system of the facility.

It is noted that the meter 10 preferably includes a means for preventing or inhibiting tampering. In particular, it is noted that if the measurement module 14 is removed from the sensor module 12, the facility to which the meter 10 is connected will continue to receive electrical power service, but will not be charged for such power usage. The facility will not be charged for such power usage because the billing information is generally obtained from the energy consumption data in the measurement module 14, and the measurement module 14 does not generate any energy consumption data when the measurement module 14 is removed from the sensor module 12. Accordingly, a potential method of meter tampering is to remove the measurement module 14 from the sensor module 12 for a few hours a day, or for one or more days, and then replace the measurement module 14 before utility service provider personnel comes to read the meter.

One exemplary arrangement for preventing tampering is shown in FIGS. 1 and 2. In particular, the measurement module 14 includes at least one, and preferably two opposing sealing members 90 which extend from opposing sides of the periphery of the measurement module 14. For each sealing member 90, the sensor module includes a pair of sealing ears 94 configured to receive each sealing member 90. The sealing member 90 has apertures 92 that are configured to align with apertures 95 on the sealing ears 94 when the meter 10 is assembled.

Once the meter 10 is assembled, a strand of pliable material, such as heavy gauge single strand copper, not shown, is passed through the apertures 92 and 95 and tied off. Then, a sealing wax or the like is applied to the pliable material such that the sealing wax must be removed to untie the pliable material to remove the pliable material from the apertures 92 and 95. As a result, utility service provider technicians can detect tampering by observing whether the wax seal has been removed.

The configuration of the meter box 13 in FIG. 2 is a standard mounting device known as a ringless-type mounting device. It will be noted that the meter 10 may readily adapted for use in a ring-type mounting device as well. A ring-type mounting device differs from the meter box 13 in FIG. 2 in that the sensor module 12 would be installed after the meter box cover 18 is assembled onto the housing 16. An annular ring would then be used to secure the sensor module 12 to the meter box cover 18. To this end, the standard meter box cover for use in a ring type mounting device includes a feature annularly disposed around the opening 25 which cooperates with the annular ring to engage and secure the sensor module 12 thereto.

Figure 3:
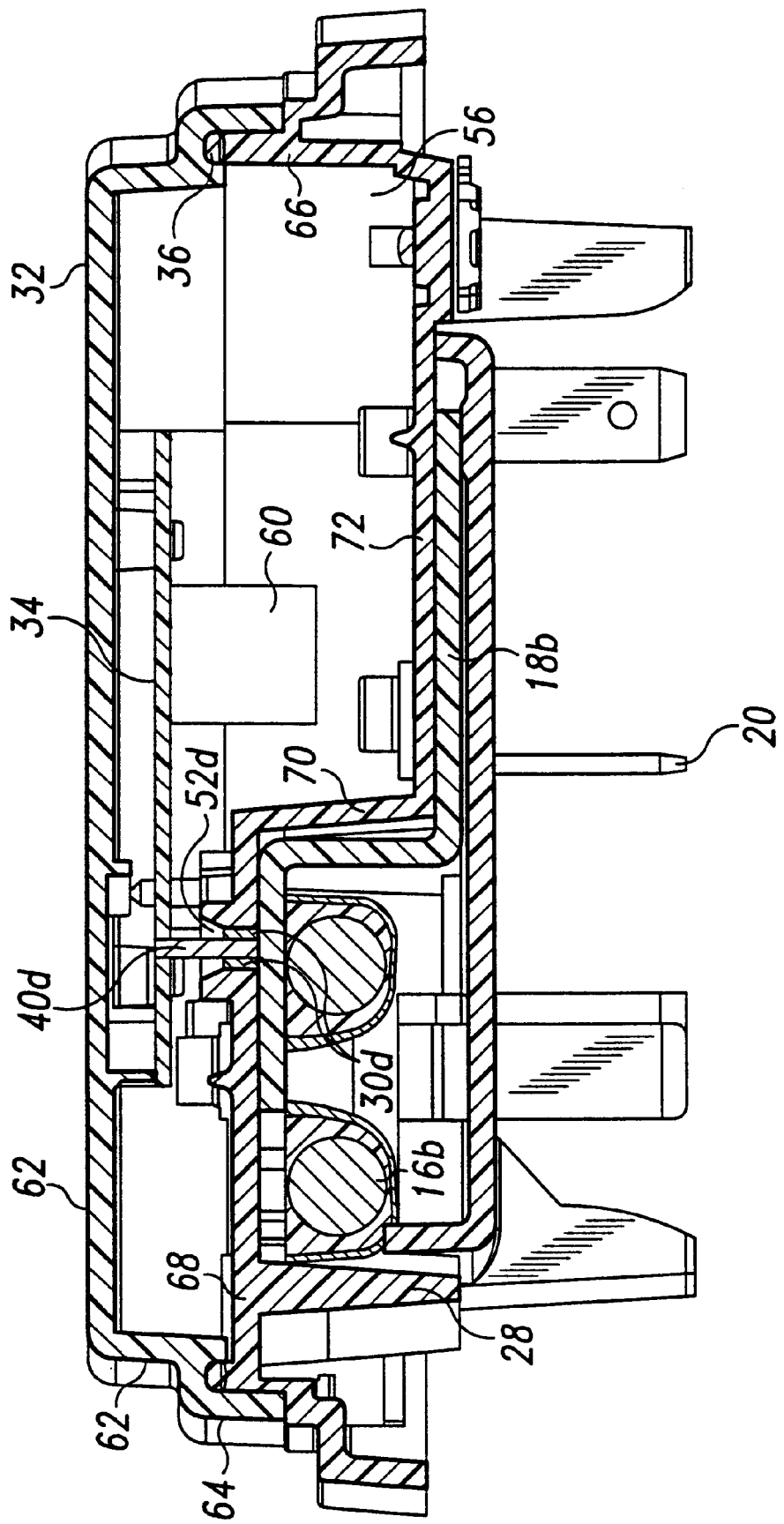
FIG. 3 shows a side view cutaway of the exemplary embodiment of the revenue meter of FIG. 1.

FIG. 3 shows a side view cutaway of the meter 10 wherein the measurement module 14 is assembled onto the sensor module 12. The face cover 32 of the measurement module 14 includes a cylindrical portion 62 and an annular skirt 64. The top plate 28 of the sensor module 12 is defined in part by an annular ridge 66. The annular ridge 66 is received by a space defined in between the annular skirt 64 and the cylindrical portion 62 of the meter cover 32. The top plate 28 is further defined by a shelf 68 that is substantially flat and abuts, in part, the cylindrical portion 62. The shelf 68 constitutes approximately one-half of the top plate 28. The other half of the top plate 28 consists of a depression 56 defined by a drop 70, a bottom 72 and a portion of the annular ridge 66. The drop 70 defines the change in depth between the shelf 68 and the bottom 72.

The depression 56 defines a space that allows for large components on the printed circuit board 34 to extend downward from the measurement module 14 below the cylindrical portion 62. In the illustrated example, components of the power supply 60 extend below the cylindrical portion 62 to occupy at least a portion of the depression 56. The two level configuration of the top plate created by the depression 56 of the sensor module 12 more efficiently utilizes the space within the meter 10. By contrast, prior art modular meters included a substantially flat interface between the sensor module and electronics module, which creates wasted space in both modules. The present invention, by arranging for the bulky components to occupy complementary portions of the meter and using an interface that includes a depression, more efficiently utilizes space within the meter 10.

As illustrated in FIGS. 1 and 3, the current transformer 16b is arranged to be horizontally disposed, or in other words, has an axial dimension that is parallel to the axial dimension of the face cover 32. As illustrated in FIG. 1, the first current transformer 16a is similarly disposed. The horizontally-disposed current transformers 16a and 16b provide significant space reduction advantages over vertically-disposed current transformers. In an electric utility meter, the horizontal footprint, for example, the length and width or diameter, is defined predominantly by the meter mounting equipment. For example, the plurality of jaws 22 of FIG. 2 define at least a minimum length and width, or in this case using a circular meter shape, a minimum diameter. The meter box, such as the meter box 15 of FIG. 2 may also dictate the minimum diameter. Accordingly, the only space reduction that is practical in a meter is in the thickness or depth dimension. By disposing the current transformer 16b horizontally, the smallest dimension of the current transformer 16b is aligned in the only dimension of the meter that can be reduced. Accordingly, the horizontally-disposed current transformers 16a and 16b further reduce the overall size of the meter 10.

As discussed above the top plate 28 also includes a plurality of openings, illustrated in FIG. 3 by the exemplary opening 52d. The opening 52d corresponds to the socket 30d, and similar openings exist that correspond to each of the other sockets 30a, 30b, 30c, 30e, 30f and 30g. (See FIG. 1) The opening 52d is preferably slightly conical to allow for alignment adjustment of the plug 40d during assembly of the measurement module 14 onto the sensor module 12. The socket 30d, which may suitably be a spring loaded terminal, is electrically connected to the current coil 18b for the purposes of providing a connection to the phase C voltage measurement, as discussed above in connection with FIG. 1.

FIG. 3 further shows the plug 40d connected to the circuit board 34 and inserted through the opening 52d and into the socket 30d. The socket 30d physically engages the plug 40d in such a manner as to provide an electrical connection therebetween. The plug 40d may suitably be an ordinary conductive pin.

It can thus be seen by reference to FIGS. 1, 2 and 3, that the electrically safe interface or top plate 28, when fitted to a cooperating meter housing, provides a substantially solid barrier between a human operator or technician and the current and voltage sensing devices when the measurement module 14 is removed for repair or replacement. The only openings are the openings, for example, opening 52d, that correspond to the sockets 30a through 30g to permit the plugs 40a through 40g to connect to the sockets 30a through 30g. Such openings are sufficiently small enough, and the sockets are sufficiently recessed within the openings, to prevent an operator from coming into direct contact with dangerous high voltages.

It will be appreciated that other interconnection means may be employed in the sensor module 12 and measurement module 14 that will also provide an electrically safe interface. For example, wireless means may be used as the interconnection means. Such wireless means could provide voltage and current measurement signals from the sensor module 12 to the measurement module 14. For example, the measurement module 14 could include sensitive electric and magnetic field sensors that obtain voltage and current measurement information from electromagnetic radiation from the current coils 18a and 18b. Likewise, optical communication means may be used to provide measurement signal information from the sensor module 12 to the measurement module. In any case, the electrically safe interface would typically include a barrier such as the top plate 28 that prevents physical access by a human operator to the current coils 18a and 18b and other dangerous portions of the sensor module 12 when the measurement module 14 is removed.

To fully obtain the benefits of modularity, it is necessary to address calibration issues in the design of the meter 10. Specifically, the sensor portion 12 of the meter must have a calibration feature that allows it to be used in connection with any suitable measurement portion. In non-modular meters, the measurement circuit is often specifically calibrated for use with a particular voltage and current sensors. The reason for the specific calibration is that there can be large variations in signal response of each voltage and current sensors. In particular, the current sensing devices, such as current transformers, often have a widely variable signal response. The signal response of commonly available current transformers varies widely in both magnitude and phase response.

The signal response of such current transformers varies to a much greater extent than the energy measurement accuracy of the meter. In other words, while the current transformer signal response may vary as much as 10%, the overall accuracy of the meter is required to be much less than 10%. Accordingly, compensation must be made for the variance, or tolerance, of the current sensing devices to ensure that the ultimate energy measurement accuracy of the meter is within acceptable tolerances. The compensation is typically carried out in the prior art by adjusting or calibrating the measurement circuit during manufacture to account for the signal response characteristics of the current sensing devices that will be used in a particular meter unit. In other words, each measurement circuit is custom-calibrated for each meter.

A truly modular meter, however, cannot require such extensive unit-specific calibration. Instead, the modular components must be readily interchangeable. Accordingly, referring again to FIG. 1, the sensor module 12 is pre-calibrated for modularity, such that the sensor module 12 may be coupled with any measurement module 14 without requiring unit-specific calibration of that measurement module 14.

To this end, the sensor module 12, and specifically the voltage and current sensors 15 are pre-calibrated such that the voltage and current sensors has a signal response within a tolerance of a predefined signal response that is no greater than the tolerance of the energy measurement accuracy of the meter 10. The energy measurement accuracy of the meter 10 is defined as the accuracy of the measured energy consumption with respect to the actual energy consumption of the facility. Thus, if the tolerance of the energy measurement accuracy of the meter is required to be 0.5%, then the difference between the measured energy consumption and the actual energy consumption will not exceed 0.5%. In such a case, the tolerance of the signal response of the voltage and current sensors will be no more than, and typically substantially less than, 0.5%. As a result, the measurement module 14 may readily be replaced with another measurement module without requiring specific calibration of the replacement measurement module.

The pre-calibration of the voltage and current sensors 15 may be accomplished using careful manufacturing processes. The primary source of variance in the signal response of the voltage and current sensors 15 is the signal response of the current transformers 16a and 16b. Generally available current transformers are prone to variance in both magnitude and phase angle signal response. Accordingly, pre-calibration involves using current transformers that are manufactured to perform within the required tolerances. As an initial matter, the current transformers 16a and 16b are manufactured using a high permeability core material, which reduces phase angle variance in the signal response. More over, the current transformers 16a and 16b are manufactured such that the actual number of turns is closely controlled. Close manufacturing control over the number of turns in the current transformers 16a and 16b produces sufficient consistency in the magnitude signal response to allow for interchangeability.

Alternatively, if controlling the number of turns during initial manufacturing is not desirable for cost reasons, then turns may be added or removed after manufacturing to achieve the desired signal response. For example, it may be more cost effective to buy wide tolerance commercially available current transformers and adjust the number of turns than to have sufficiently narrow tolerance current transformers specially manufactured.

Figure 4:
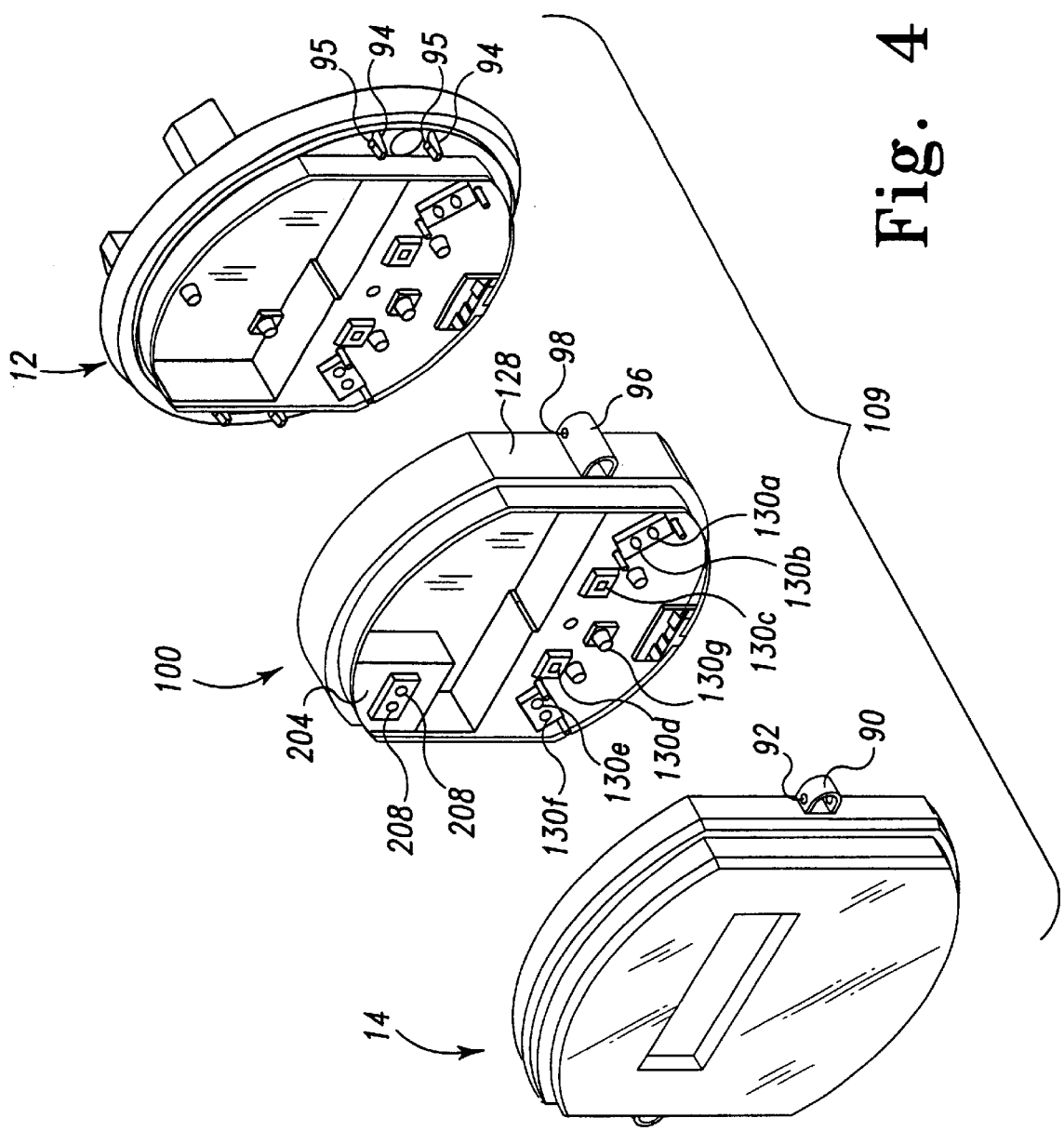
FIG. 4 shows a perspective view of an exemplary embodiment of a meter according to the present invention that includes an expansion module wherein the sensor module, the measurement module, and the expansion module are unassembled.

FIGS. 1, 2, and 3 thus describe a modular meter 10 that performs at least basic metering functions and which may be enhanced through the addition of a removable expansion module, such as the removable expansion module 100 of FIG. 4. In particular, FIG. 4 shows a perspective view of an exemplary embodiment of the meter 10a according to the present invention that includes the sensor module 12 of FIG. 1, the measurement module 14 of FIG. 1, and an expansion module 100. In FIG. 4, the sensor module, the measurement module, and the expansion module are unassembled.

As will be discussed more fully below in connection with FIGS. 7, 8, and 9 the expansion module 100 operably couples the measurement circuit of the measurement module 14 to the voltage and current sensors 15 of the sensor module 14. As also discussed below in connection with FIG. 8, the expansion module 100 also preferably includes an enhancement circuit that provides an operational enhancement to the meter 10a in comparison to the meter 10 of FIG. 1. Such an enhancement circuit may provide external communications, load profiling, redundant metering, power quality measurement or other functions that are advantageously housed in a revenue meter.

Referring now to FIG. 4, the expansion module 100 includes a housing 128 that includes a first interface and a second interface. The first interface is located on the opposite side of the second interface and is therefore hidden from view. The second interface comprises a plurality of sockets 130a, 130b, 130c, 130d, 130e, 130f and 130g configured to receive corresponding plugs 40a, 40b, 40c, 40d, 40e and 40f of the measurement module 14 (see FIG. 1). The first interface includes a corresponding number of plugs, not shown (but see plugs 140d and 140f of FIG. 5) configured to be received by the corresponding sockets 30a, 30b, 30c, 30d, 30e, 30f and 30g of the sensor module 12.

Within the housing 128 is circuitry (see FIG. 8) that electrically connects each of the plurality of sockets 130a, 130b, 130c, 130d, 130e, 130f, and 130g to a corresponding plug on the first interface. Accordingly, the expansion module 100 effectively connects each of the plugs 40a through 40g of the measurement module 14 to the corresponding socket 30a through 30g of the sensor module 12. The enhancement circuit is also located within the housing 128.

The expansion module 100 in the exemplary embodiment described herein further includes a data connector enclosure 204 that encloses, at least partially, one or more data connectors (see FIG. 5) within the housing 128. The one or more data connectors are configured to receive corresponding data connectors, not shown (but see FIG. 5) of the measurement module 14.

In one alternative embodiment, the expansion module 100 does not include an enhancement circuit. In such a case, the data connectors would not be necessary, but otherwise the expansion module 100 would remain the same. Although such an embodiment does not enhance the metering functionality of the meter 10a, the expansion module 100 nevertheless serves to expand the physical size of the meter 10a. Such size expansion can be advantageous to suit particular needs of consumers. In particular, as noted above, the meter 10 of FIG. 1 achieves substantial size reduction which provides advantages for shipping, manufacturing, storing and installation. However, the low profile of the meter 10 is not always advantageous in certain situations. For example, a meter enclosure may be designed to allow visual inspection of the meter display through a window. Such enclosures are designed to accommodate the large profile prior art meter designs. In such circumstances, the low profile of the meter 10 may actually make the meter 10 more difficult to read while the meter 10 is installed in the meter enclosure. To overcome this relatively infrequent problem, an expansion module 100 that has no enhancement circuit may be employed.

Referring again to FIG. 4, the expansion module 100 preferably also includes an arrangement for inhibiting tampering that is compatible with the sealing members 90 and the sealing ears 94 discussed above in connection with FIGS. 1 and 2. In particular, the expansion module 100 includes a device for preventing separation of the expansion module 100 and the measurement module 14, as a unit, from the sensor module 12. To this end, the expansion module 100 includes a sealing member 96 similar in structure to the sealing member 90. Accordingly, the sealing member 96 includes apertures 98 that are configured to be aligned with the apertures 95 on the sealing ears 94 of the sensor module 12.

Once the meter 10a is assembled, a strand of pliable material, not shown, is threaded through the apertures 98 and 95 and then tied off. As discussed above in connection with FIGS. 1 and 2, a sealing wax is then applied to the strand of pliable material.

It is noted that such a tamper protection configuration does not, without more, prevent removal of the measurement module 14 from the expansion module 100 while the meter 10a is installed. To prevent such an occurrence, it is contemplated that the expansion module 100 may be affixed to the measurement module 14 by way of a screw or other fastener, not shown, that may only be accessed when the expansion module 100 is removed from the sensor module 12. In such a case, the measurement module 14 could only be removed when the expansion module 100 is removed from the sensor module 12, which would then require the wax seal to be broken. Alternatively, the strand of pliable material may be constructed to thread through all of the apertures 92, 95 and 98 before application of the sealing wax.

Figure 7:
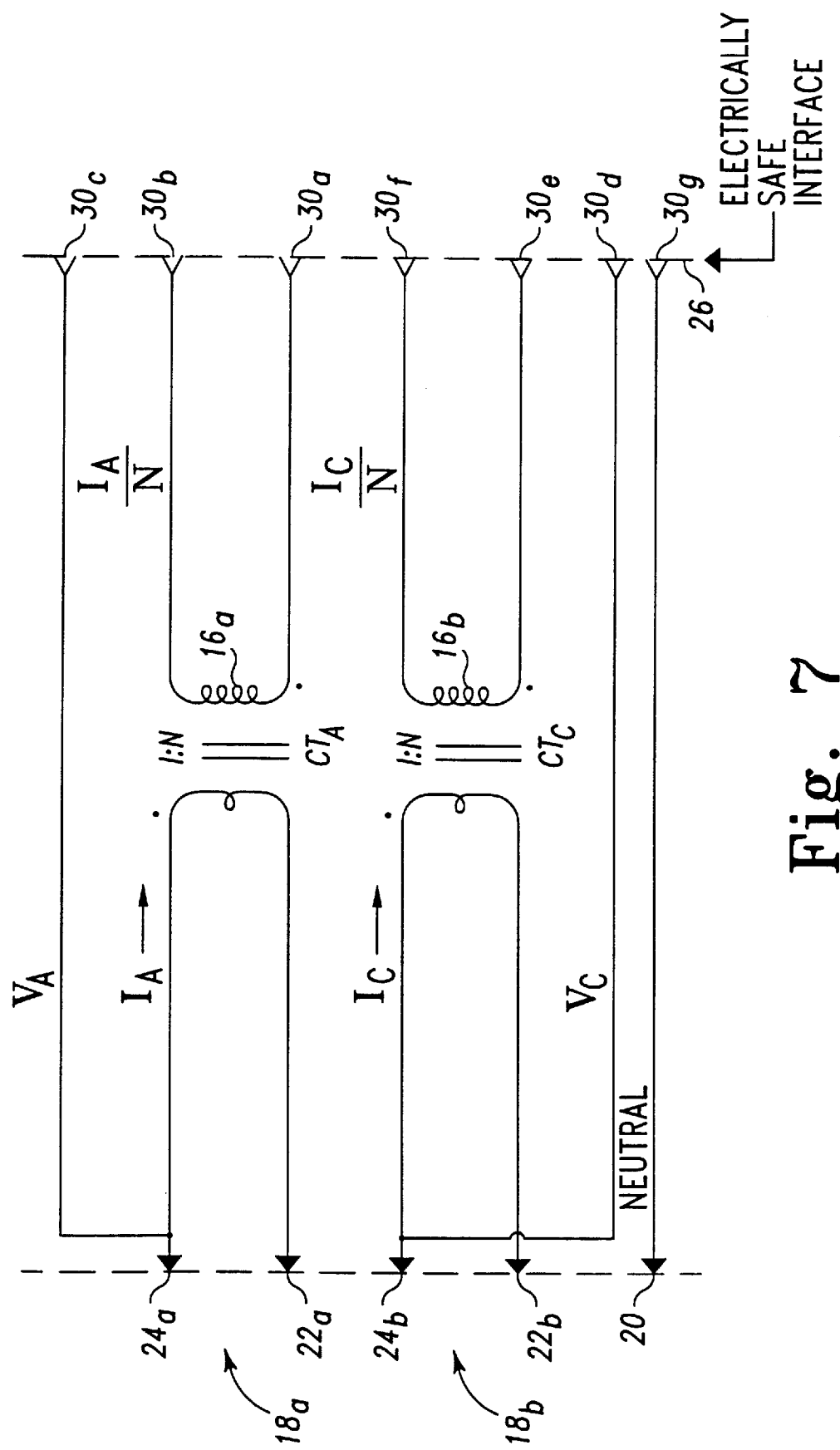
FIG. 7 shows a circuit block diagram of the sensor module of the exemplary embodiment of the revenue meter of FIGS. 1 and 4.
Figure 8:
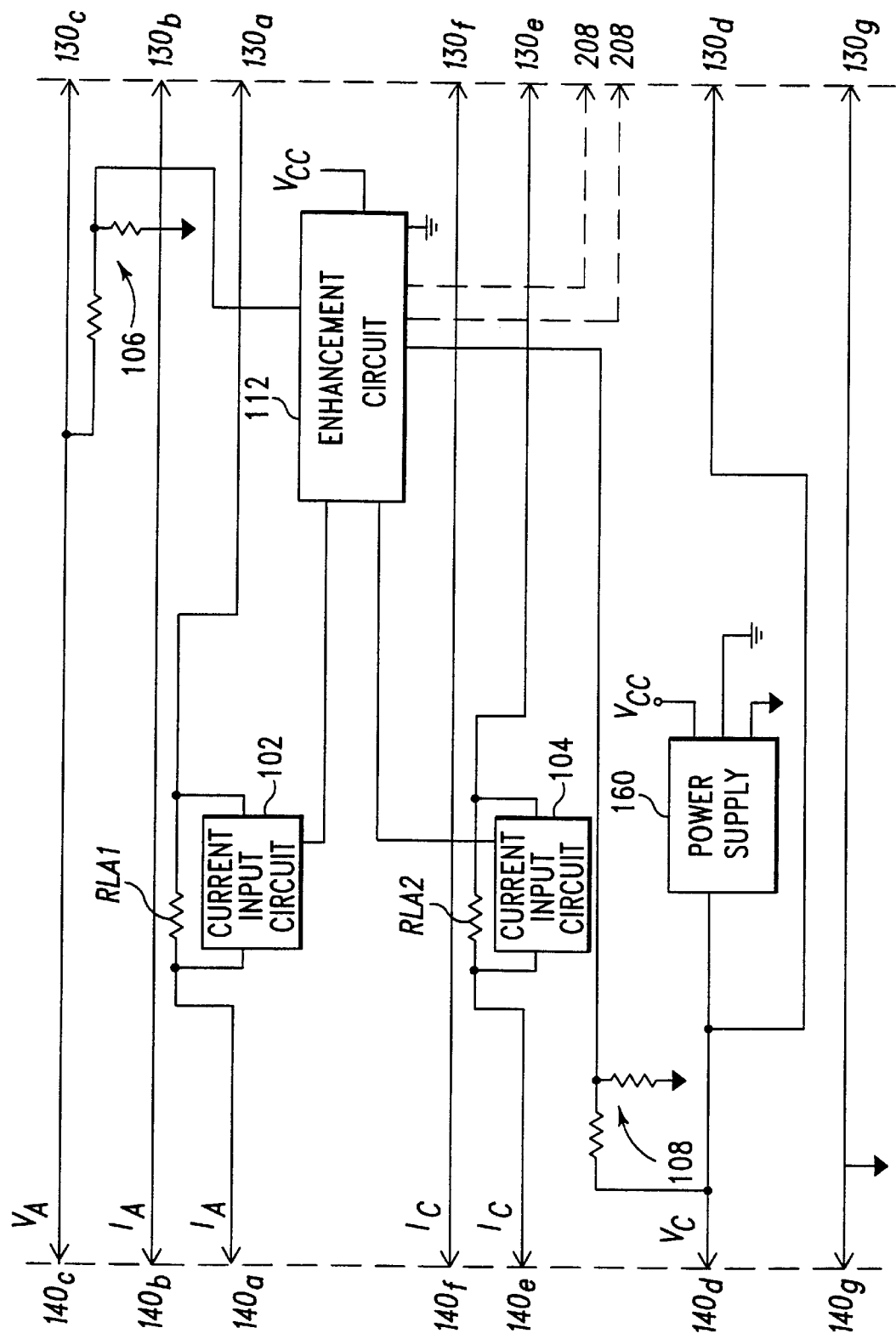
FIG. 8 shows a circuit block diagram of the expansion module of the revenue meter of FIG. 4.

FIGS. 7, 8 and 9 show circuit block diagrams of the meter 10a. FIG. 7 shows a circuit block diagram of the sensor module 12. FIG. 8 shows a circuit block diagram of the expansion module 100. FIG. 9 shows a circuit block diagram of the measurement module 14. It will be noted that the circuit diagrams of FIGS. 7, 8 and 9 are given by way of example only. Those of ordinary skill in the art may readily employ their own circuits that perform the same functions described generally below and still benefit from many of the advantages provided by inclusion of the expansion module within a modular meter.

Referring now to the circuit block diagram of the sensor module 12 and FIG. 7, the sockets 30a and 30b provide a connection to the first current transformer 16a, the sockets 30e and 30f provide a connection to the second current transformer 16b, the socket 30c provides a connection to the first current coil 18a, the socket 30d provides a connection to the second current coil 18b, and the socket 30g provides a connection to one or more of the neutral blades 20.

Referring now to the expansion module 100 in FIG. 8, each of the plugs 140a through 140g provide a connection to the corresponding socket 30a through 30g (FIG. 7) of the sensor module 12 when the meter 10a is assembled. Similarly, each of the sockets 130a through 130g provide a connection to a corresponding plug 40a through 40g (FIG. 9) of the measurement circuit 14. As discussed above, each of the plugs 140a through 140g provides a connection to the corresponding socket 130a through 130g within the expansion module 100 to allow the measurement signals generated in the sensor module 12 to more or less pass through to the measurement module 14.

In the exemplary embodiment described herein, the expansion module 100 further includes a phase A current input circuit 102, a phase C current input circuit 104, a phase A voltage input circuit 106, a phase C voltage input circuit 108, a power supply 160 coupled to the phase C voltage line through the plug 140d, and an enhancement circuit 112. The enhancement circuit 112 in the exemplary embodiment described herein may suitably be a redundant measurement circuit that performs the same functions as the measurement circuit 42 of FIG. 9, discussed below.

The phase A current input circuit 102 is a device for obtaining a scaled signal indicative of the line current waveform on phase A. To this end, the phase A current input circuit 102 is connected across a line resistor RLA1 that is series connected between the plug 140a and the socket 130a. Likewise, the phase C current input circuit 104 is a device for obtaining a scaled signal indicative of the line current waveform on phase C. To this end, the phase C current input circuit 104 is connected across a line resistor RLA2 that is series connected between the plug 140e and the socket 130e. The outputs of the phase A and phase B current input circuits 102 and 104 are provided to the enhancement circuit 112.

The phase A voltage input circuit 106 is a voltage divider network tapped off of the connection to plug 140c. Similarly, the phase C voltage input circuit 108 is a voltage divider network tapped off of the connection to the plug 140d. The power supply 160 is a device the receives AC input line voltage and generates a dc bias voltage Vcc therefrom. Such power supplies are well known in the art. The power input to the power supply 160 is preferably tapped off of the connection to the plug 140d. The outputs of the phase A and phase C voltage input circuits 106 and 108 are provided to the enhancement circuit 112. Optionally, the enhancement circuit 112 is operably connected to the data connectors 208.

FIG. 9 shows a circuit block diagram of the measurement circuit 42 and associated display 38 for use in the measurement module 14. The measurement circuit 42 includes a watt measurement integrated circuit ("IC") 44, a microprocessor 48 and a non-volatile memory 50. Plugs 40a, 40b, 40c, 40d, 40e, and 40f are each connected to the watt measurement IC 44 through various input circuits. In particular, the plugs 40a and 40b are connected to the watt measurement IC 44 through a phase A current input circuit 212, the plugs 40e and 40f are connected to the watt measurement IC through a phase C current input circuit 214, the plug 40c is connected to the watt measurement IC 44 through a phase A voltage input circuit 216, and the plug 40d is connected to the watt measurement IC 44 through a phase C voltage input circuit 218.

The watt measurement IC 44 is a device that receives measurement signals representative of voltage and current signals in an electrical system and generates energy consumption data therefrom. In the exemplary embodiment described herein, the watt measurement IC 44 may suitably be the conversion circuit 106 described in U.S. patent application Ser. No. 08/690,973 or the conversion circuit 106 described in U.S. patent application Ser. No. 08/881,140, both of which are assigned to the assignee of the present invention and incorporated herein by reference.

Alternatively, the watt measurement IC 44 may be replaced by one or more discrete circuits capable of carrying out the same function of generating energy consumption information from the voltage and current measurement signals. For example, the watt measurement IC 44 may suitably be replaced by the first and second watt measurement ICs 44 and 46 described in the U.S. patent application Ser. No. 08/862,844, which is assigned to the assignee of the present invention and incorporated herein by reference.

In any event, the watt measurement IC 44 is further operably connected to the microprocessor 48 through a bus structure 220. The bus structure 220 consists of one or more serial and or parallel busses that allow for data communication between the microprocessor 48 and the watt measurement IC 44. In general, the watt measurement IC 44 provides energy consumption data to the microprocessor 48 and the microprocessor 48 provides control and calibration data to the watt measurement IC 44.

The microprocessor 48 is further connected to the memory 50 and the display circuit 38.

In the operation of the exemplary meter 10a illustrated in FIGS. 4, 7, 8, and 9, energy consumption measurements are carried out in the following manner. As discussed above, the present embodiment is intended for use with a 12S meter form that is generally associated with a three-wire network configuration. A three-wire network configuration, as is well known in the art, includes a phase A power line, a phase C power line, and a neutral line. The present invention, however, is in no way limited to use in a three wire network configuration. The concepts described herein may readily be implemented in meters used in other configurations, including single phase and other polyphase configurations.

In operation, the plurality of jaws 22 provide the phase A power line signal, in other words, the phase A voltage and current, across the blades 22a and 24a of the first current coil 18a (see FIG. 1). Similarly, the plurality of jaws 22 provide the phase C power line signal across the blades 22b and 24b of the second current coil 18b (see FIG. 1). Referring to FIG. 7, the phase A current flows from the blade 24a through the first current coil 18a to the blade 22a. The first current coil 18a imposes a scaled version of the current, referred to herein as the phase A current measurement signal, on the first current transformer 16a. The phase A current measurement signal is approximately equal to the current flowing through the current coil 18a scaled by a factor of N1, where N1 is the turns ratio of the current transformer 16a. The phase A current measurement signal is provided to the sockets 30a and 30b. The first current coil 18a is further operably connected to provide the phase A voltage to the socket 30c.

Similar to the phase A current, the phase C current flows from the blade 24b of the second current coil 18b to the blade 22b. The phase C current is imposed onto the second current transformer 16b, thereby causing the second current transformer 16b to generate a phase C current measurement signal. The phase C current measurement signal is approximately equal to the phase C current scaled by a factor of N2, where N2 is the turns ratio of the second current transformer 16b. The turns ratios N1 and N2 of the current transformers 16a and 16b, respectively, are typically substantially similar and preferably equal. However, manufacturing tolerances may result in slight differences in the turns ratios N1 and N2. In any event, the second current transformer 16b provides the phase C current measurement signal to the sockets 30e and 30f. The second current coil 18b is also operably connected to the socket 30d for the purposes of providing the phase C voltage thereto. The neutral blade 20 provides a connection between the neutral power line and the socket 30g.

It is noted that potentially hazardous electrical signals reside on one or more of the sockets 30a through 30g. In particular, the sockets 30c and 30d provide a direct connection to the external or utility power line, and therefore are potentially extremely dangerous. Moreover, the sockets 30a, 30b, 30e, and 30f all include current measurement signals that are potentially dangerous to humans, depending somewhat on the overall power consumption of the facility being metered and the turns ratios N1 and N2. Accordingly, the relatively small physical size of the sockets 30a through 30g and their corresponding openings greatly inhibits and preferably prevents human contact with the socket connections.

Continuing with the general operation of the meter 10a, the sockets 30a and 30b (FIG. 7) provide the phase A current measurement signal to the plugs 140a and 140b, respectively, of the expansion module 100 (FIG. 8). Likewise, the sockets 30e and 30f (FIG. 7) provide the phase C current measurement signal to the plugs 140e and 140f, respectively, of the expansion module 100 (FIG. 8). The sockets 30c and 30d (FIG. 7), provide, respectively, the phase A and phase C voltage measurement signals to the plugs 140c and 140d (FIG. 8). The neutral socket 30g (FIG. 7) provides a neutral connection to the plug 40g of FIG. 8.

Referring to FIGS. 8 and 9, the phase A current measurement signal propagates from the plugs 140a and 140b to the sockets 130a and 130b (FIG. 8), which, in turn, provide the phase A current measurement signal to the plugs 40a and 40b, respectively, of the measurement module 14 (FIG. 9). Likewise, phase C current measurement signal propagates from the plugs 140e and 140f to the sockets 130e and 130f (FIG. 8), which, in turn, provide the phase C current measurement signal to the plugs 40e and 40f, respectively, of the measurement module 14 (FIG. 9). The phase A and phase C voltage measurement signals propagate from the plugs 140c and 140d, respectively, to the sockets 130c and 130d of the expansion module 100 (FIG. 8). The sockets 130c and 130d (FIG. 8) then provide, respectively, the phase A and phase C voltage measurement signals to the plugs 40c and 40d (FIG. 9). The plug 140g provides the neutral connection to the socket 130g (FIG. 8), which, in turn, provides a neutral connection to the plug 40g of FIG. 9.

In the exemplary embodiment described herein the phase A current measurement signal also propagates to the enhancement circuit 112 through the phase A current input circuit 102, the phase C current measurement signal propagates to the enhancement circuit 112 through the phase C current input circuit 104, the phase A voltage measurement signal propagates to the enhancement circuit 112 through the phase A voltage input circuit 106, and the phase A voltage measurement signal propagates to the enhancement circuit 112 through the phase C voltage input circuit 108.

The enhancement circuit 112 then uses the voltage and current measurement signals to provide functionality to the meter 10a in addition to that provided by the measurement circuit 42 of FIG. 9. In the exemplary embodiment described herein, the enhancement circuit 112 provides redundant metering capabilities. To this end, the enhancement circuit 112 may suitably include a watt measurement IC similar to the watt measurement IC 44 and a microprocessor similar to the microprocessor 48.

Redundant metering provides complete redundancy in the operations of the measurement circuit 42. Redundant metering enhances the ability to the meter 10a to withstand critical failure or partial failure of one or more components in the measurement circuit 42. In particular, if the measurement circuit 42 fails due to external or internal causes, metering revenue would ordinarily be lost until the failure is detected and the measurement module 14 replaced. However, the redundant metering provided by the enhancement circuit 112 can avoid such loss of revenue.

It may be preferable to allow the enhancement circuit 112 to communicate with the measurement circuit 42 to verify measurements during operation of the meter 10a. To this end, the enhancement circuit 112 is preferably connected to the bus structure 220 of the measurement circuit 42 throught the data connections 208 and 206 (FIGS. 8 and 9).

In an alternative embodiment, the enhancement circuit 112 may include a power quality circuit, such as that described in U.S. Pat. No. 5,627,759, which is incorporate herein by reference. In such a case, the enhancement circuit 112 would use the measurement signals to perform power quality measurements and report any detected disturbances in the power line. To this end, the enhancement circuit 112 may further include communication circuitry.

In yet another alternative embodiment, the enhancement circuit 112 may simply include one or more external communication devices, such as, for example, radio communication circuits, power line carrier communication circuits, and/or telephone modem circuits, all of which are well known in the art. The enhancement circuit 112 in this alternative embodiment thus serves as a communication vehicle for the measurement circuit 42. In such an embodiment, the expansion circuit 100 need not include the various input circuits 102, 104, 106 and 108 because the enhancement circuit 112 does not necessarily require the measurement signals. Instead, the enhancement circuit 112 is preferably connected to the bus structure 220 of the measurement circuit 42 through the data connections 208 and 206 to receive energy consumption data and other data therefrom.

It is noted that if the enhancement circuit 112 includes a telephone modem circuit, a direct or indirect connection to a public switched telephone network or other communication network must also be provided to the enhancement circuit 112. Likewise, if the enhancement circuit 112 includes a power line carrier communication circuit, direct connections to the power lines must be provided to the enhancement circuit 112. Those of ordinary skill in the art may readily modify the expansion module 100 to includes such connections as required.

Moreover, an external communication circuit within enhancement circuit 112 may be used to allow remote programming of the meter 10a, and in particular, the watt measurement IC 44 and/or the microprocessor 48. To this end, the external communication device within the enhancement circuit 112 would receive control programming (or calibration) information from a remote source and provide the control programming information to the watt measurement IC 44 and/or the microprocessor 48 through the bus structure 220 within the measurement circuit 42.

In yet another embodiment, the enhancement circuit 112 may include a load profile circuit. In general, a load profile circuit is a circuit that records the energy consumption for distinct intervals of time. For example, a load profile circuit may record energy consumption for consecutive one-hour intervals over a month. Such information can provide the utility and customer valuable information about the times when the customer utilizes the most energy. Load profile circuits are well known in the art.

In such an embodiment, the enhancement circuit 112 would include at least a memory for storing the consumption information for the time intervals. The enhancement circuit 112 may further include separate processors for coordinating the operation of load profile circuit, communication circuits for communicating the load profile information periodically to an external device, and/or a calendar/clock circuit for providing time stamp information to the load profile circuit. However, the enhancement circuit 112 may alternatively utilize analogous structures already located within the measurement circuit 42. It is noted that such an embodiment does not require the various input circuits 102, 104, 106 and 108, but may instead obtain energy consumption information from either the microprocessor 48 or the watt measurement IC 44 through the bus structure 220 and the data connectors 206 and 208.

It will thus be appreciated that the expansion module 100 may house an enhancement circuit 112 that provides one or more of a wide range of features to the base meter 10 of FIG. 1. Such features and embodiments of the enhancement circuit 112 are in no way limited to the examples described above. Moreover, an enhancement circuit 112 may include a combination of the features. Likewise, more than one expansion modules 100 having different features may be daisy-chained between the sensor module 12 and the measurement module 14, thereby allowing each customer to custom-configure his or her meter.

Referring again to FIG. 9, at least the basic metering functions are provided by the measurement circuit 42 within the measurement module 14. It will be noted, however, that the "basic metering functions" of the measurement circuit 42 may include far more than simple energy measurement functions. For example, the basic metering functions provided by the measurement circuit 42 may include at least a part of one or more of the advanced features described above, as well as other features such as service type recognition, diagnostics, or the like.

In any event, the plugs 40a and 40b provide the phase A current measurement signal to the watt measurement IC 44 through the phase A current input circuit 212. The phase A current input circuit 212 preferably converts the phase A current measurement signal to a voltage signal having a magnitude and phase that is representative of the phase A current. The socket 40c provides the phase A voltage measurement signal through the phase A voltage input circuit 216 to the watt measurement IC 44.

The plugs 40e and 40f similarly provide the phase C current measurement signal to the watt measurement IC 44 through the phase C current input circuit 214. The phase C current input circuit 214 preferably converts the phase C current measurement signal to a voltage signal having a magnitude and phase that is representative of the phase C current. The socket 40d provides the phase C voltage measurement signal through the phase C voltage input circuit 218 to the watt measurement IC 44. The socket 40d further provides the phase C voltage to the power supply 60. The power supply is further connected to the neutral plug 40g and operates to provide a bias voltage to each of the functional block circuits within the measurement module 14.

The watt measurement IC 44 receives the phase A and phase C voltage and current measurement signals, and generates energy consumption data therefrom. To this end, the watt measurement IC 44 preferably samples, multiplies and accumulates the measurement signals as is known in the art to generate watt data, VA data, and/or VAR data. See, for example, U.S. patent application Ser. No. 08/690,973 or U.S. patent application Ser. No. 08/881,140, as discussed above, for a description of such operations.

The processor 48 then obtains watt data, VA data, and/or VAR data and further processes the data to provide energy consumption information in standard units in accordance with metering industry standards. The energy consumption information is communicated externally through the display 38. Alternatively or additionally, the energy consumption information may be communicated through an external communication circuit, not shown.

Figure 5:
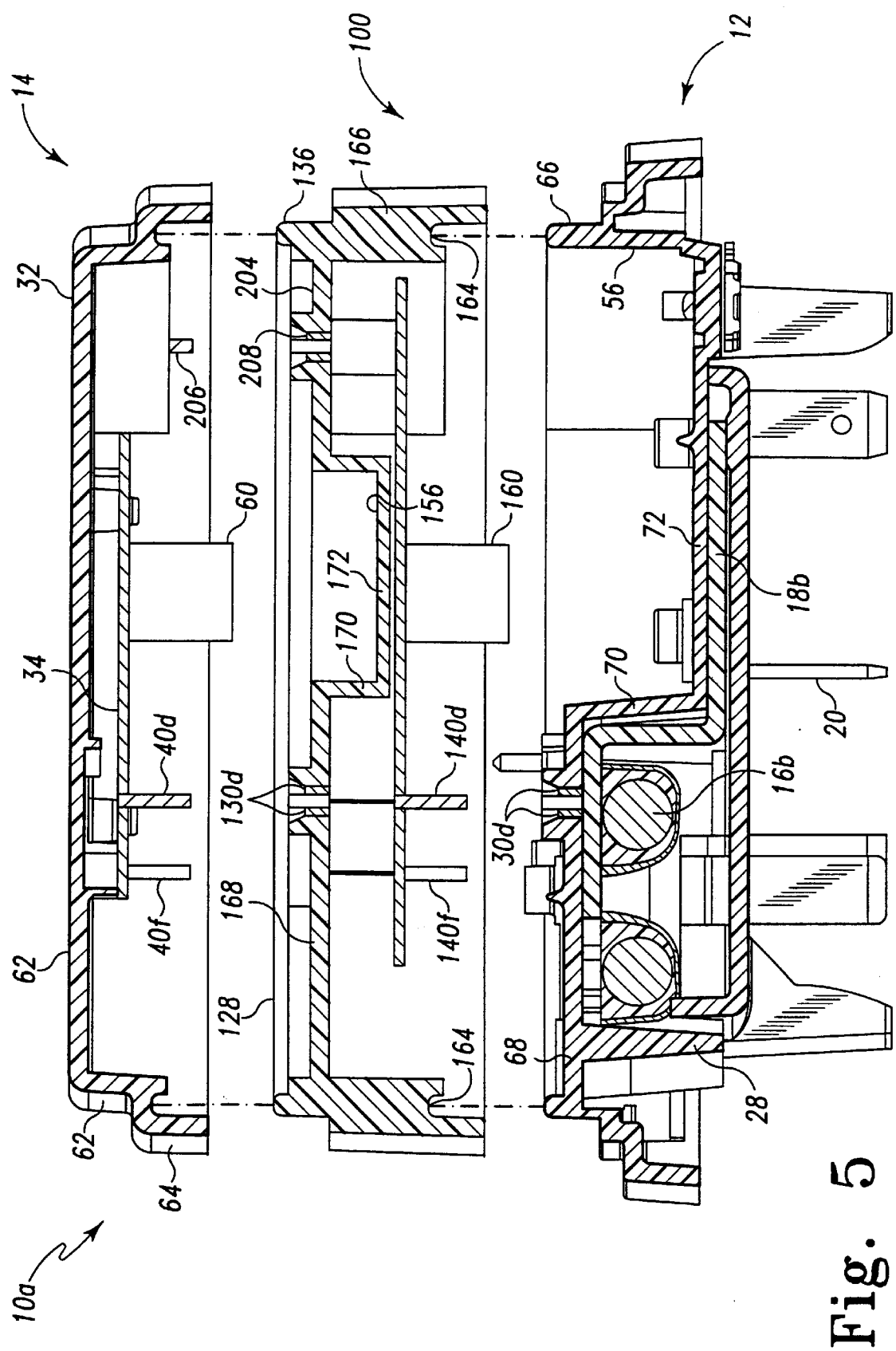
FIG. 5 shows a side view cutaway of the meter of FIG. 4, wherein the sensor module, the measurement module, and the expansion module are unassembled.
Figure 6:
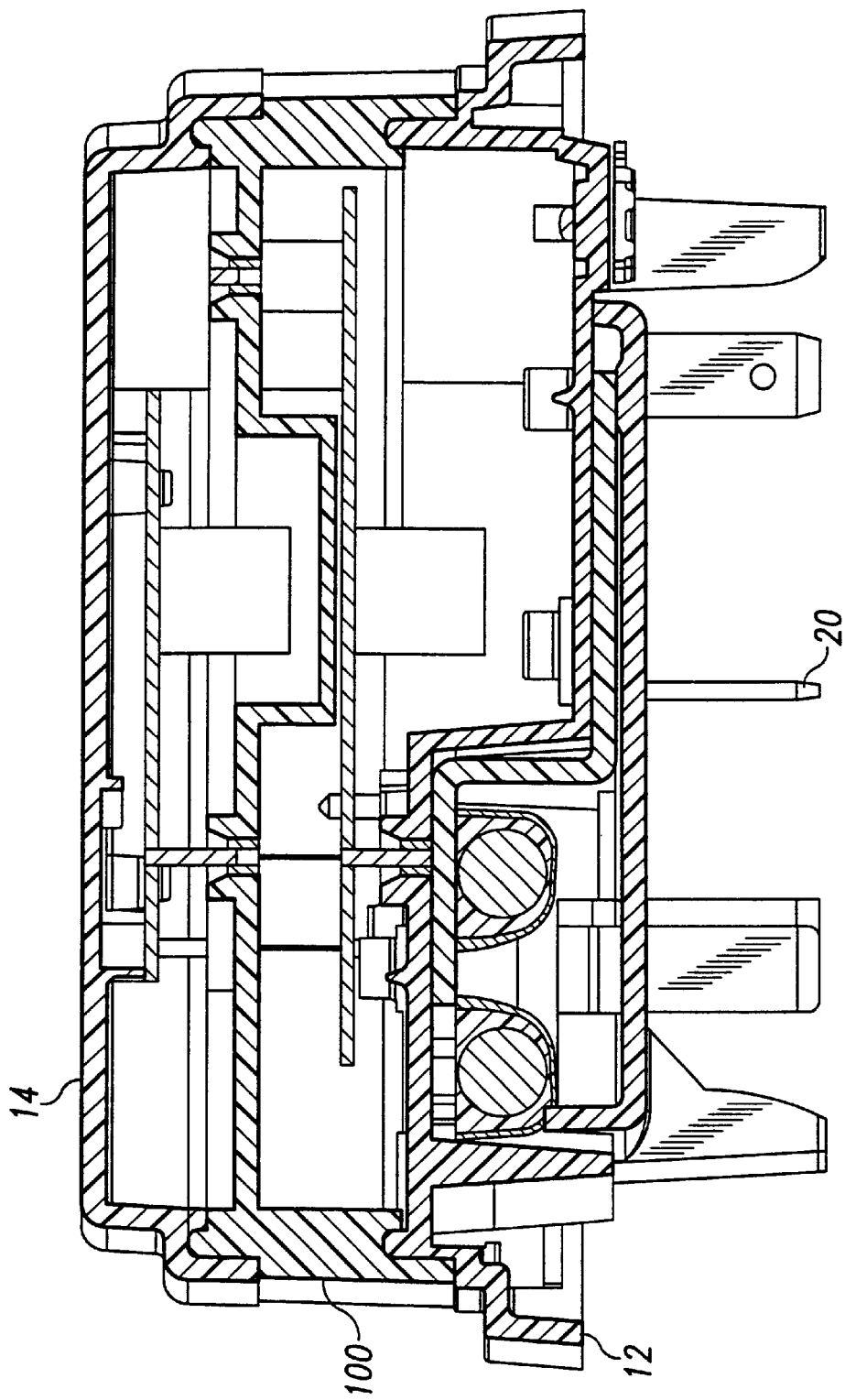
FIG. 6 shows a side view cutaway of the meter of FIG. 4, wherein the sensor module, the measurement module, and the expansion module are assembled.

Further detail regarding the structure of the expansion module 100 is provided in FIGS. 5 and 6. FIGS. 5 and 6 show a side view cutaway of the expansion module 100 interposed between the sensor module 12 and the measurement module 14. FIG. 5 shows the meter 10a in an unassembled state and FIG. 6 shows the meter 10a completely assembled.

The expansion module housing 128 in the exemplary embodiment described herein comprises an annular wall 166, a shelf 168, a drop 170, a bottom 172, a data connection enclosure 204 and an annular channel 164. The annular wall 166 has radial dimensions that correspond to the dimensions of the sensor module 12 and the measurement module 14. The annular wall 166 terminates at the top with an annular ridge 136 having a similar diameter and configured to be received in the space defined between the annular skirt 64 and the cylindrical portion 62 of the measurement module 14. The annular wall 166 terminates at its bottom in the annular channel 164 which is configured to receive the annular ridge 66 of the sensor module 12.

The configuration of the annular ridge 136 and the annular channel 164 thus permit the expansion module 100 to be interposed between the sensor module 12 and measurement module 14. The shelf 168, the drop 170, the bottom 172, and the data connection enclosure 204 define a plate structure of the second interface of the expansion module 100 that may suitably inhibit human contact with structures within the housing 128, thereby providing an electrically safe interface. However, the expansion module 100 need not include an electrically safe interface to benefit from many of the advantages of the present invention.

In any event, the shelf 168 extends from one end of the annular wall 166 to define structural support for the sockets 130a through 130g. (Note that only sockets 130d and 130f are visible in FIG. 5). The sockets 130a through 130g preferably have the same structure as the socket 30d, discussed above in connection with FIG. 3. The shelf 168 extends partially across the expansion module 100 and terminates at the drop 170. The drop 170 extends inward and terminates at the bottom 172. It is noted that the shelf 168, the drop 170 and the bottom 172 may all have similar dimension as the shelf 68, the drop 70 and the bottom 72 of the sensor module 12.

The bottom 172, however, differs from the bottom 72 of the sensor module in the exemplary embodiment described herein because it terminates at the data connection enclosure 204. The data connection enclosure 204 is a small box-like substructure that provides support for the data connection 208. In any event, the enclosure 204, the drop 170, and bottom 172 define a depression 156 for receiving bulky components of the measurement module 14, such as, for example, the power supply 60.

It is noted that in the exemplary embodiment described herein, the meter 10 is a type of meter commonly known in the industry as a self-contained meter. In a self-contained meter, the current coils of the meter, such as current coils 18a and 18b of the present invention, carry the entire current load of the electrical system. As a result, in a typical meter, if the meter is removed for repair or replacement, the current coils are removed from the jaws of the meter box, and power to the facility is interrupted. A distinct advantage of the present invention is that the measurement module 14 may be removed for repair, replacement or upgrade without removing the current coils 18a and 18b. As a result, the facility experiences no electrical service interruption during the replacement.

In any event, the meters 10, and 10a described herein provide several features and advantages to servicing, upgrading, and repairing revenue meters. In particular, the present invention includes a method of upgrading an electronic utility meter in a manner that does not interrupt the electrical service to the facility being metered.

In an exemplary method according to the present invention, a technician upgrades the meter 10 shown in FIGS. 1, 2 and 3 to provide the enhanced operation of the meter 10. Initially, the meter 10 is connected between the power lines and the electrical system of a facility, not shown.

The technician then removes the measurement module 14 from the sensor module 12 while the sensor module 12 is electrically connected to the electrical system and while said electrical system is providing power to the facility. The technician then couples the measurement module 14 to one or more expansion modules 100. The technician then replaces the expansion module 100, which is coupled the measurement module 14, to the sensor module 12. In such an operation, the meter 10 is upgraded to the meter 10a without interrupting the power to the facility. Moreover, at no time is the technician exposed to hazardous voltages arising from the removal of the measurement module. It is noted that if the expansion module 100 has an electrically safe interface such as in the embodiment described herein, the technician may alternatively first install the expansion module 100 onto the sensor module 12, and then install the measurement module 14 onto the expansion module 100 without ever being exposed to hazardous voltages.

There are therefore a plurality of advantages of the present invention arising from the flexible expansion, safety, space saving, and other features described herein. It will be noted that alternative embodiments of the present invention may not include all of the features described herein yet still benefit from at least some of the advantages described herein. Those of ordinary skill in the art may readily devise their own such implementations that incorporate one or more of the features of the present invention and fall within the spirit and scope thereof.

What is claimed:

1. An electronic utility meter coupled to an electrical system of a facility, the electronic utility meter comprising:
   a) a sensor module configured to connect to the electrical system, said sensor module including voltage and current sensors, said voltage and current sensors operable to receive voltage and current signals from the electrical system and generate measurement signals therefrom;
   b) a measurement module including a measurement circuit operable to receive measurement signals and generate energy consumption data therefrom, said measurement module including a device for communicating information relating to the energy consumption data, said measurement module operable to be coupled to the sensor module to connect the measurement circuit to the voltage and current sensors;
   c) an expansion module interposed between the sensor module and the measurement module, the expansion module operably coupling the measurement circuit to the voltage and current sensors.

2. The electronic utility circuit of claim 1 wherein the expansion module comprises an enhancement circuit that provides an operational enhancement to the meter.

3. The electronic utility meter of claim 2 wherein the device for communicating information relating to the energy consumption data comprises a visual display and wherein the enhancement circuit further comprises a remote communication device.

4. The electronic utility meter of claim 2 wherein the enhancement circuit includes a power quality measurement circuit.

5. The electronic utility meter of claim 2 wherein the measurement circuit further comprises a first data connector and wherein the expansion module further comprises a second data connector operably coupled to the first data connector, said second data connector further connected to the enhancement circuit.

6. The electronic utility meter of claim 1 wherein:
   the sensor module further comprises a first interconnection means;
   the measurement module further comprises a second interconnection means configured to couple to the first interconnection means to electrically connect the measurement circuit to the voltage and current sensors; and
   the expansion module comprises a first interface configured to couple to the first interconnection means and a second interface configured to couple to the second interconnection means.

7. The electronic utility meter of claim 6 wherein the first interconnection means includes an electrically safe interface.

8. The electronic utility meter of claim 7 wherein the second interface includes an electrically safe interface.

9. A removable expansion module for use in an electronic utility meter, the electronic utility meter including a sensor module and a measurement module, the sensor module including voltage and current sensors operable to receive voltage and current signals from the electrical system and generate measurement signals therefrom, the measurement module including a measurement circuit operable to receive measurement signals and generate energy consumption data therefrom, the measurement module further including a device for communicating information relating to the energy consumption data, the removable expansion module including:
   a first interface configured to be coupled to the sensor module to receive measurement signals therefrom; and
   a second interface configured to be coupled to the measurement circuit to provide measurement signals thereto.

10. The removable expansion module of claim 9 further comprising an enhancement circuit that provides an operation enhancement to the meter.

11. The removable expansion module of claim 10 further comprising a data connection configured to connect to the measurement circuit to receive power consumption data therefrom.

12. The removable expansion module of claim 10 wherein the enhancement circuit includes a communication circuit.

13. The removable expansion module of claim 10 wherein the enhancement circuit includes a power quality circuit.

14. The removable expansion module of claim 10 wherein the enhancement circuit includes a load profile circuit.

15. The removable expansion module of claim 9 wherein the second inteface includes an electrically safe interface.

16. The removable expansion module of claim 15 wherein the electrically safe interface comprises a plate structure.

17. The electronic utility meter of claim 16 wherein the second interface includes a plurality of sockets defined in the plate structure, said plurality of sockets configured to receive a corresponding plurality of plugs located on the measurement module.

18. The electronic utility meter of claim 17 wherein the plurality of sockets each have a first dimension and a second dimension, the first dimension having at least the same size as the second dimension, and wherein the second dimension is less than 1/8 inch, thereby preventing substantial access of a human operator through the sockets.

19. A method of servicing an electronic utility meter, said revenue meter operably connected to an electrical system of a facility for the purpose of measuring a power consumption of the facility, said method comprising:

a) removing a measurement module of the electronic utility meter from a sensor module of the electronic utility meter, said sensor module including voltage and current sensors, said voltage and current sensors operable to receive voltage and current signals from the electrical system and generate measurement signals therefrom, wherein said measurement module includes a measurement circuit operable to receive measurement signals and generate energy consumption data therefrom, said measurement module including a display for displaying information relating to the energy consumption data; and b) connecting a removable expansion module between the measurement module and the sensor module, the removable expansion module operably coupled to receive the measurement signals and provide the measurement signals to the measurement circuit.

20. The method of claim 19 wherein step b) further comprises connecting the removable module between the measurement module and the sensor module wherein the removable module further comprises an enhancement circuit that provides an operational enhancement to the meter.

21. The method of claim 19 wherein step a) further comprises removing the measurement module from the sensor module while the sensor module is electrically connected to the electrical system and while said electrical system is providing power to said facility.

* * * * *